(12) United States Patent
Chen et al.

(10) Patent No.: US 6,639,151 B1
(45) Date of Patent: Oct. 28, 2003

(54) FIXING STRUCTURE FOR EXTENSION CARDS

(75) Inventors: Aries Chen, Taipei (TW); Chang Lu Chang, Taipei (TW)

(73) Assignee: First International Computer Inc., Taipei (TW)

( * ) Notice: Subject to any disclaimer, the term of this patent is extended or adjusted under 35 U.S.C. 154(b) by 0 days.

(21) Appl. No.: 10/330,256

(22) Filed: Dec. 30, 2002

(51) Int. Cl.[7] ................................................. H05K 7/14
(52) U.S. Cl. ........................ 174/65 R; 174/61; 174/50; 361/796; 361/732; 361/683; 361/752
(58) Field of Search ................................ 174/65 R, 66, 174/67, 51, 50; 220/3.2, 4.01, 241, 242; 361/796, 752, 728, 730, 729, 736, 788, 683, 759, 732, 801, 825; 211/41.17

(56) References Cited

U.S. PATENT DOCUMENTS

| | | | | |
|---|---|---|---|---|
| 5,251,109 A | * | 10/1993 | Baitz | 361/752 |
| 5,694,291 A | * | 12/1997 | Feightner | 361/683 |
| 5,757,618 A | * | 5/1998 | Lee | 361/759 |
| RE36,695 E | * | 5/2000 | Holt | 174/67 |
| 6,058,025 A | * | 5/2000 | Ecker et al. | 174/35 R |
| 6,138,839 A | * | 10/2000 | Cranston et al. | 211/41.17 |
| 6,231,139 B1 | * | 5/2001 | Chen | 361/788 |
| 6,307,754 B1 | * | 10/2001 | Le et al. | 361/796 |
| 6,442,038 B1 | * | 8/2002 | Erickson et al. | 211/41.17 |
| 6,480,393 B1 | * | 11/2002 | Chen | 361/759 |
| 6,487,070 B2 | * | 11/2002 | Gan | 361/752 |
| 6,552,913 B2 | * | 4/2003 | Tournadre | 174/51 |

* cited by examiner

Primary Examiner—Dean A. Reichard
Assistant Examiner—Angel R. Estrada
(74) Attorney, Agent, or Firm—Browdy and Neimark, P.L.L.C.

(57) ABSTRACT

A fixing structure for extension cards includes a set of extension slots, a positioning element and a resilient plate. The positioning element engages on an external side of the set of the extension slots, and the resilient plate is fixing on an internal side of the set of the extension slots. A folded edge of the resilient plate is inserted through a first mounting slot of the positioning element to firmly secure the positioning element on a computer casing. A stem of the resilient plate is pulled toward an inside of the computer casing to release the folded edge of the resilient plate from the first mounting slot of the positioning element so that the positioning element is pushed upward to disengage from the set of extension slots.

10 Claims, 7 Drawing Sheets

FIXING STRUCTURE FOR EXTENSION CARDS

BACKGROUND OF THE INVENTION

1. Field of the Invention

The invention relates to a fixing structure for extension cards. More specifically, the invention relates to a structure for fixing extension cards to a computer casing.

2. Description of the Related Art

A computer mainboard has a plurality of insertion slots for receiving different extension cards. As the functions of the computer become numerous and complex, accommodating spaces available to assemble/disassemble the extension cards may be is limited. Furthermore, from an economical aspect, component parts of the computer are usually fabricated by different manufacturers. Therefore, the compatibility between the different computer elements should be as high as possible in order to facilitate their assembly.

Figure 1:
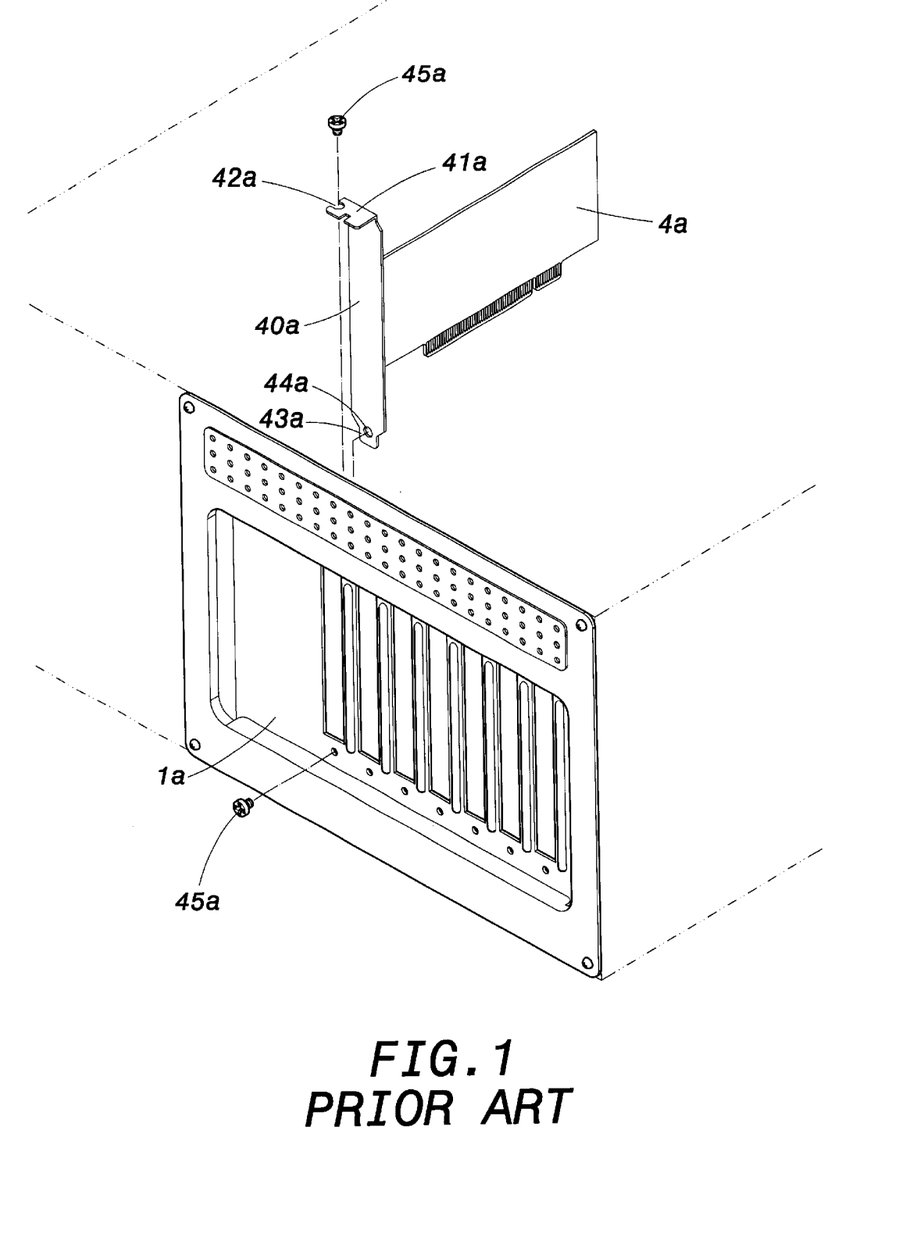
FIG. 1 is an exploded view of a conventional fixing structure for extension cards.
Figure 2:
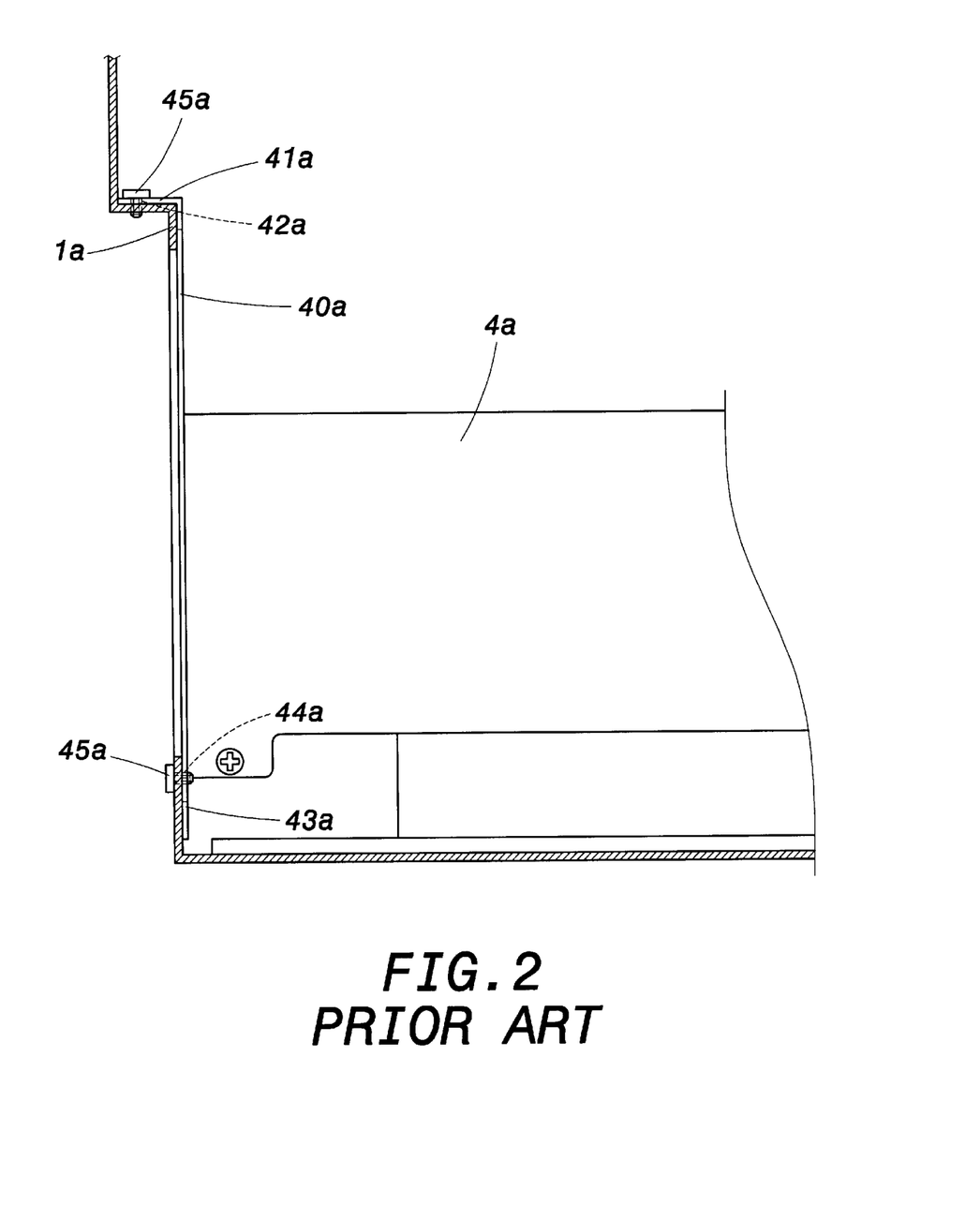
FIG. 2 is a cross-sectional view of a conventional fixing structure for extension cards.

FIG. 1 and FIG. 2 show a conventional fixing structure for extension cards. An extension card 4a has a metal plate 40a that includes a bent portion 41a at its top and a fixing portion 43a at its bottom. The extension card 4a is principally screwed onto a set of extension slots la by inserting a screw that engages through a notch 42a of the bent portion 41a and a fixing hole 44a of the fixing portion 43a. Since the assembly of a computer may be manually performed by the user, he/she therefore can manually assemble the extension card into or dismount it from the computer. From the manufacturer position, high compatibility with different specifications of computer casings is therefore required. A critical factor for a normal operation of the extension card is that it is firmly attached to the computer casing.

With the above known fixing structure, an additional tool is often required to screw and attach the extension card. The relatively small size of the screw may cause its loss. Furthermore, if the screw is not engaged tightly, the electrical connection between the extension card and the computer mainboard may not be correctly established.

SUMMARY OF THE INVENTION

It is therefore a principal object of the invention to provide a fixing structure for extension cards that allows an easier assembly/disassembly, of the extension card and is suitable for various computer casings.

It is another object of the invention to provide a fixing structure for extension cards by which the extension card(s) is easily replaced while the attachment between the extension card and the computer casing is firmly achieved.

It is still another object of the invention to provide a fixing structure for extension cards in which the electrical connection between the extension card with the computer mainboard is adequately established so as to ensure a normal operation of the extension card.

In order to achieve the above and other objectives, it is to provide a fixing structure for extension cards respectively having a metal plate that has a bent portion at its top and a fixing portion at its bottom, the bent portion further having a notch. The fixing structure includes a set of extension slots, a positioning element and a resilient plate. The set of extension slots is formed on a computer casing for fixing the extension card. A fin outwardly extends from the rear side of the computer casing at a location above the slots. An opening is formed on the fin for receiving the bent portion of the metal plate of the extension card. The positioning element includes a pressing portion for pressing against the fin, and a mounting portion vertically connected to the pressing portion. The mounting portion has an engagement hook for engaging an engaging hole of the set of the extension slots. The mounting portion has a first slot. The resilient plate centrally has a contact portion. A stem extends from a back surface of the contact portion. A first folded edge is formed at a bottom of a front surface of the contact portion. The resilient plate further has a first fixing hole through which the resilient plate is fastened onto an inner wall of the computer casing by inserting a fastening element in a manner that the first folded portion of the resilient plate is inserted through the first slot.

To provide a further understanding of the invention, the following detailed description illustrates embodiments and examples of the invention, this detailed description being provided only for illustration of the invention.

BRIEF DESCRIPTION OF THE DRAWINGS

The drawings included herein provide a further understanding of the invention. A brief introduction of the drawings is as follows.

DETAILED DESCRIPTION OF THE EMBODIMENTS

Wherever possible in the following description, like reference numerals will refer to like elements and parts unless otherwise illustrated.

Figure 3:
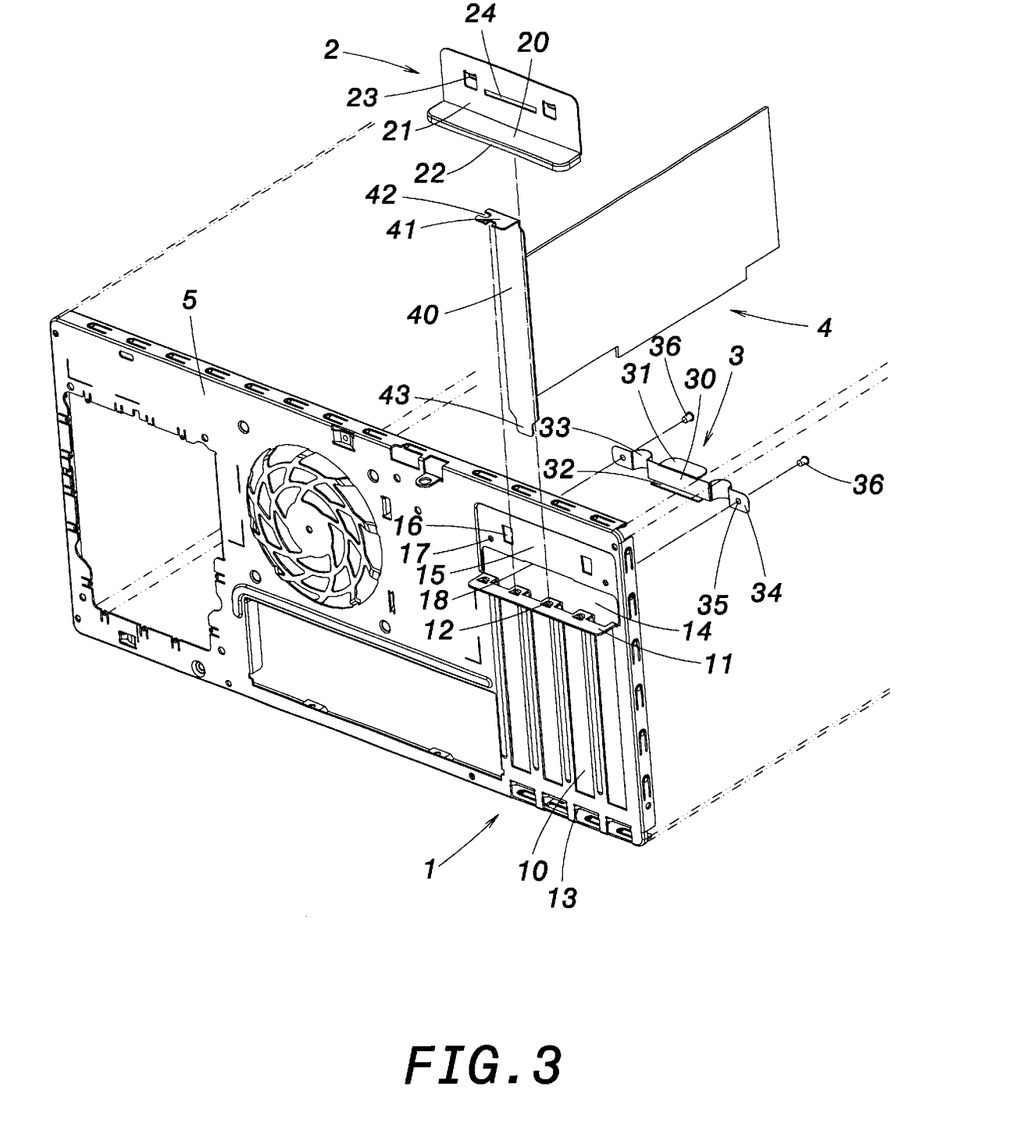
FIG. 3 is a partial perspective view of a fixing structure for extension cards in a computer casing according to an embodiment of the invention.
Figure 4:
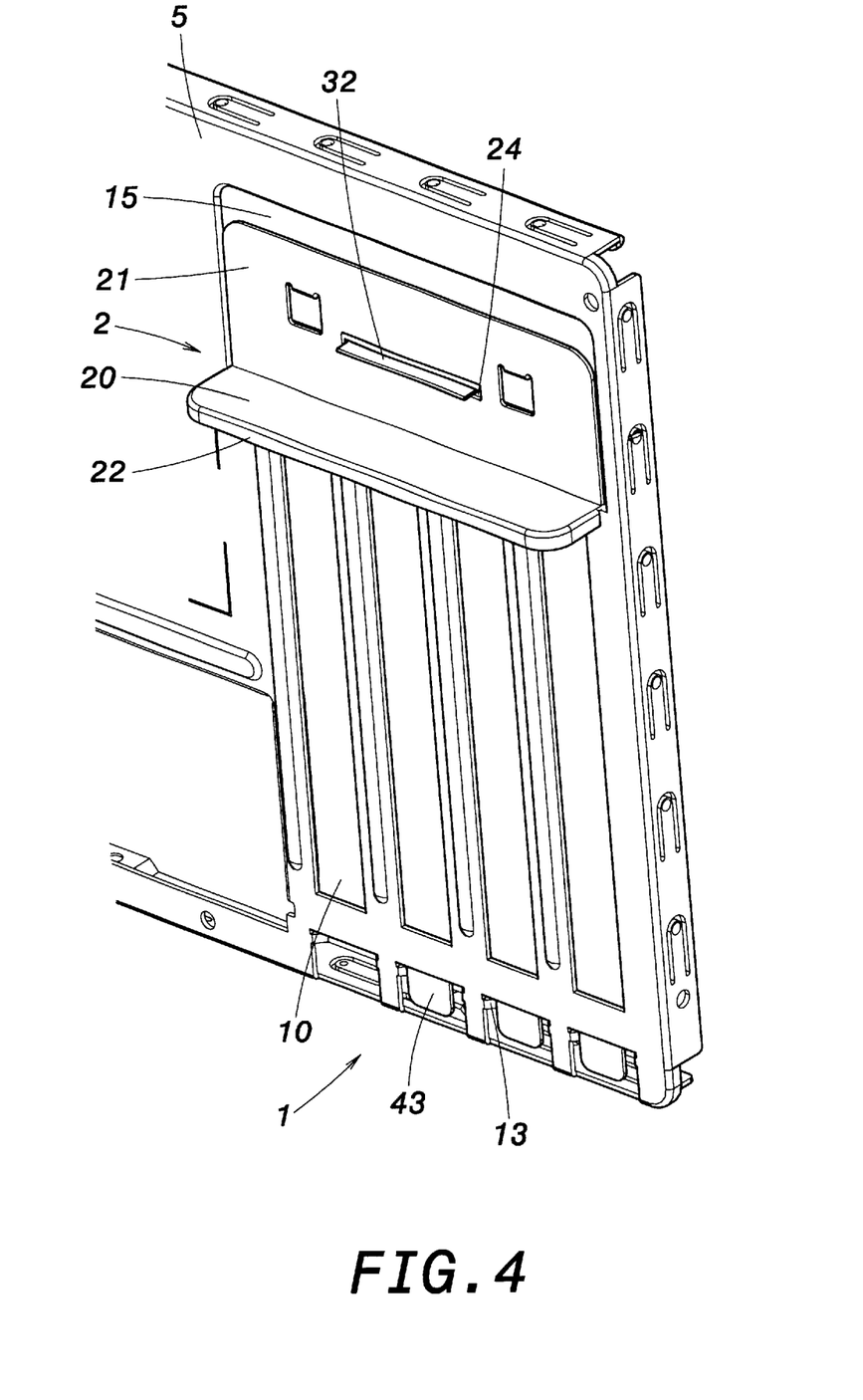
FIG. 4 is an enlarged outer view of a fixing structure for extension cards according to an embodiment of the invention.
Figure 5:
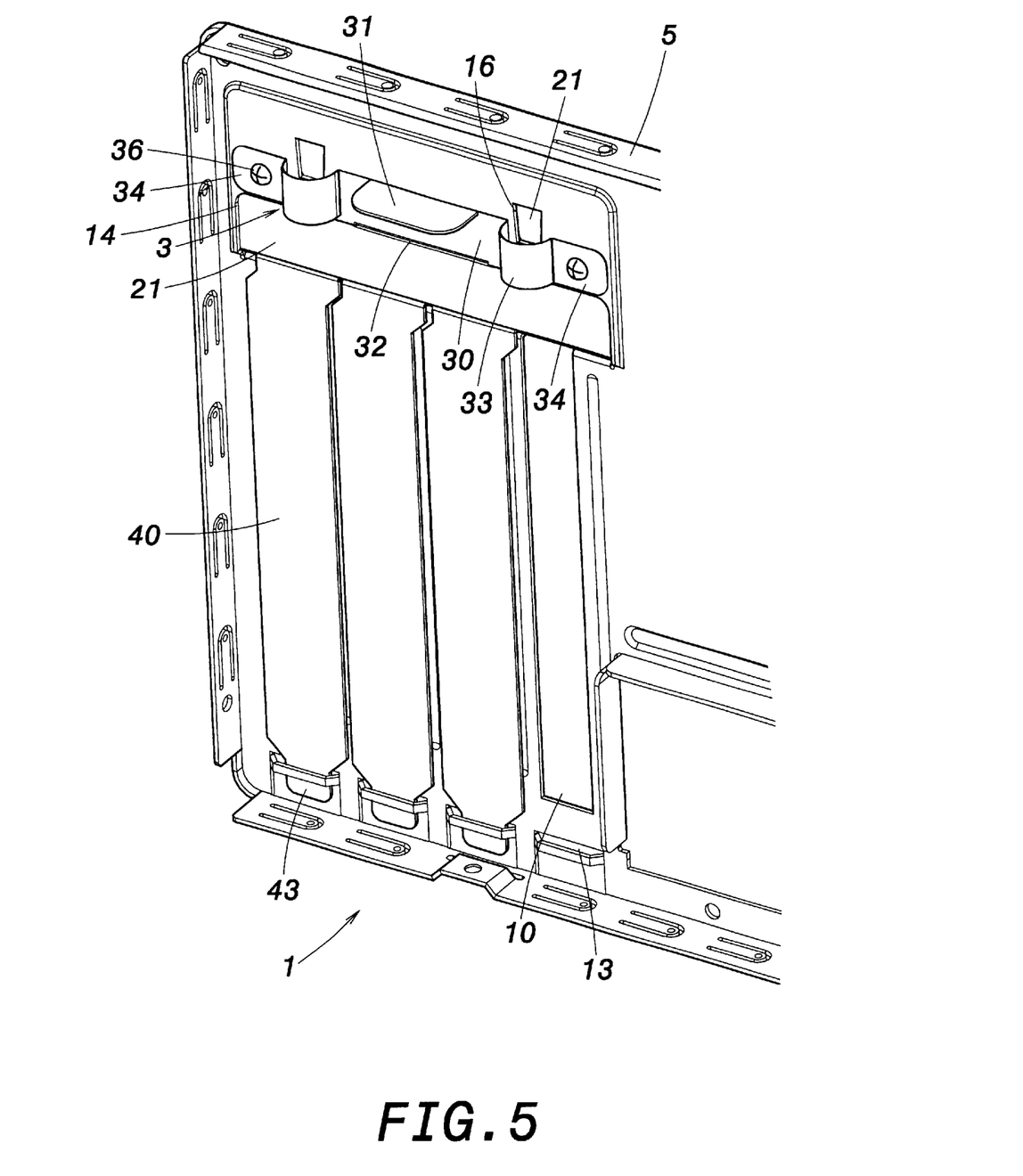
FIG. 5 is an enlarged inner view of a fixing structure for extension cards according to an embodiment of the invention.
Figure 6:
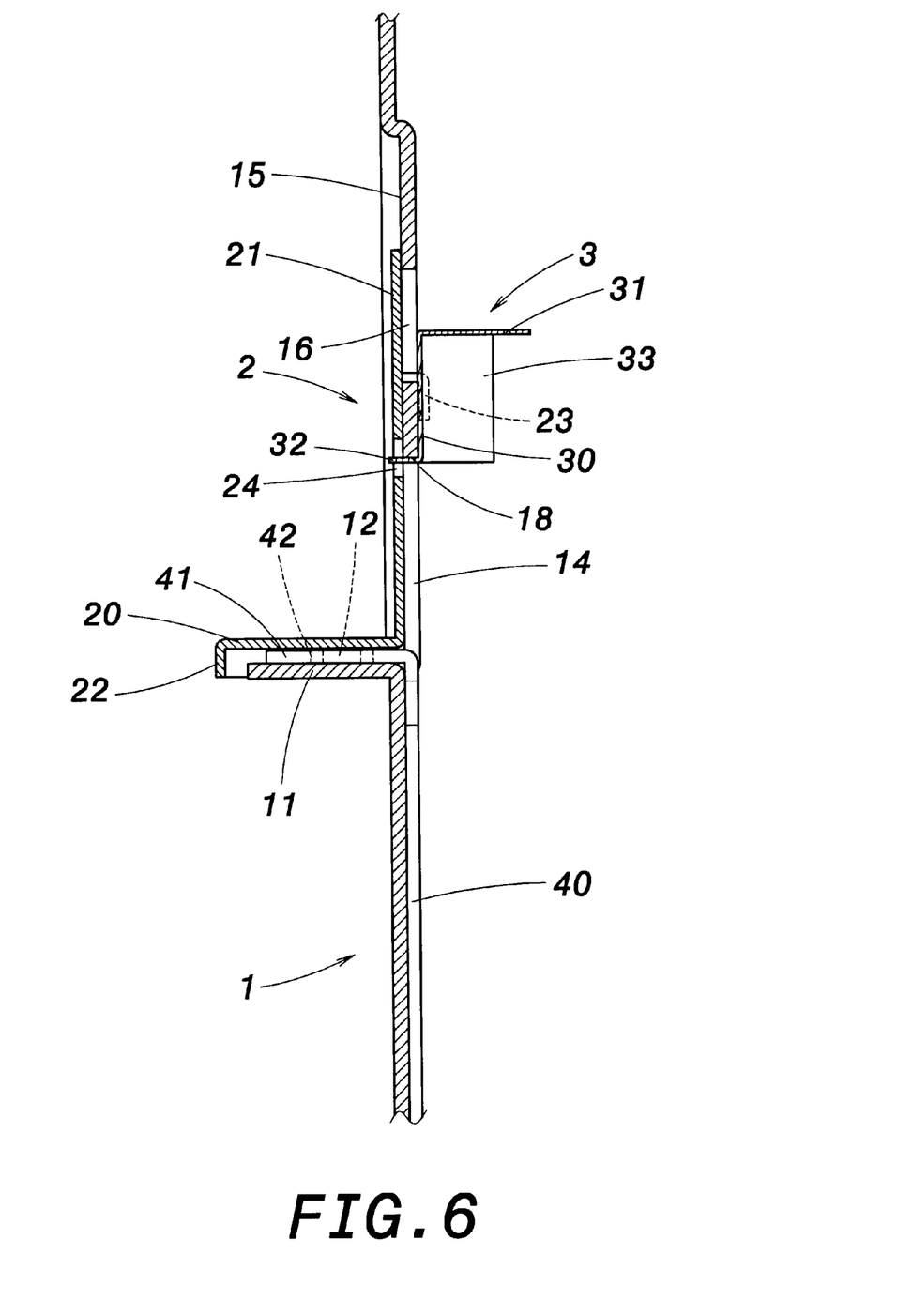
FIG. 6 is a cross-sectional view of a fixing structure for extension cards according to an embodiment of the invention.
Figure 7:
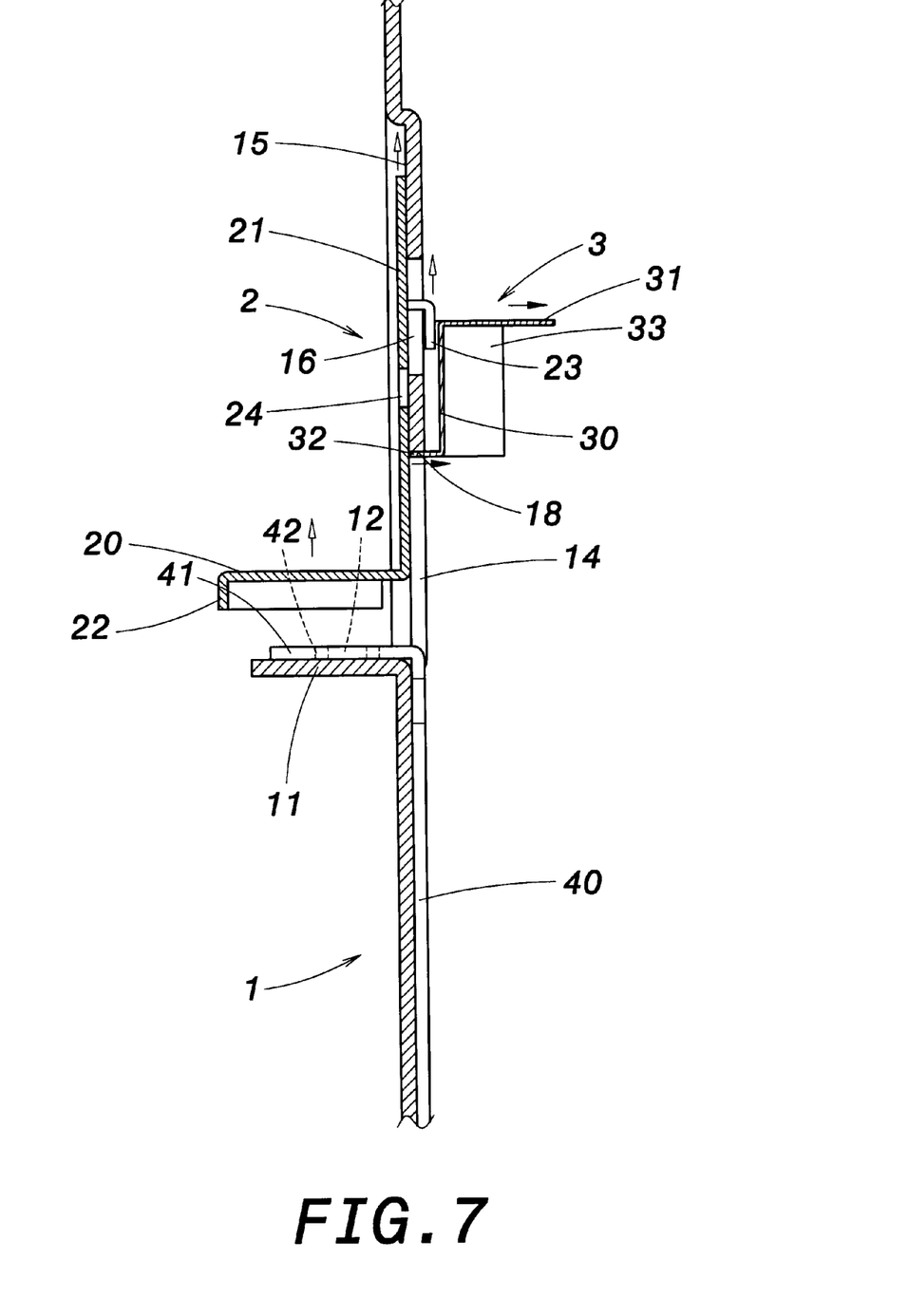
FIG. 7 shows an operation of a fixing structure for extension cards according to an embodiment of the invention.

FIG. 3 is an exploded view of a fixing structure for extension card according to an embodiment of the invention. An extension card 4 has a metal plate 40 connected at one side thereof. The metal plate 40 has a bent portion 41 at its top and a fixing portion 43 at its bottom. The bent portion 41 further has a notch 42. The structure for fixing the extension card includes a set of extension slots 1, a positioning element 2, and a resilient plate 3.

The set of extension slots 1, including a plurality of extension slots 10, is mounted on a rear side of a computer casing 5 for mounting at least one extension card 4. At a top of the set of extension slots 1, a fin 11 extends outwardly from the computer casing 5. A plurality of bumps 12 are further formed on a top surface of the fin 11 so that one of the bumps 12 engages with the notch of the metal plate 40. An opening 14 is formed on the top of the fin 11 on the rear side of the computer casing 5, through which the bent portion 41 of the metal plate 40 is inserted. A plurality of inserting holes 13 are respectively formed under the extension slots 10 on the rear side of the computer casing 5 to respectively receive the fixing portion 43 of the metal plate 40. A recess region 15 is formed above the opening 14 on the rear side of the computer casing 5. Two engaging holes 16 are further formed in the recess region 15. At least one fixing hole 17 is formed near each of the engaging holes 16. A slot 18 is formed near a middle portion of a lower edge of the recess region 15.

The positioning element 2 has a pressing portion 20 for pressing against the fin 11, and a mounting portion 21 vertically connected to the pressing portion 20. A folded edge 22 is formed along a side of the pressing portion 20. The mounting portion 21 has two engagement hooks 23 formed in a manner to respectively engage with the engaging holes 16 of the recess region 15 so that the mounting portion 21 abuts against the recess region 15. Between the engaging hooks 23 is provided a slot 24 corresponding to the slot 18 in the recess region 15.

The resilient plate 3 centrally has a contact portion 30. A stem 31 extends from a back surface of the contact portion 30 in a direction vertical to a length of the contact portion 30. A folded edge 32 is formed at a bottom of a front surface of the contact portion 30. Two curved portions 33 respectively extend from two opposite sides of the contact portion 30. Two fixing pieces 34 further respectively extend from the curved portions 33 along the length of the contact portion 30. Each of the fixing pieces 34 has a fixing hole 35 corresponding to the fixing hole 17 of the set of extension slots 1. The fixing piece 34 is fastened onto an inner wall of the computer casing 5 by inserting a fastening element through the fixing holes 35, 17, so that the folded edge 32 of the resilient plate 3 passes through the slot 18 of the set 1 and the slot 24 of the positioning element 2.

As shown in FIG. 4 through FIG. 7, the engagement hooks 23 of the positioning element 2 respectively engage with the engaging holes 16 of the recess region 15 to firmly press the mounting portion 21 against the recess region 15. The folded edge 32 of the resilient plate 3 passes through the slot 24 of the positioning element 2 to prevent vertical movement of the positioning element 2. When the extension card 4 is to be mounted, the stem 31 of the resilient plate 3 is pulled toward the internal portion of the computer casing 5, so that the curved portions 33 are moved outwardly due to the deformation of the resilient plate 3. Thereby, the folded edge 32 of the contact potion 30 is released from the slot 24 of the positioning element 2. Therefore, the positioning element 2 can be pushed upward to respectively disengage the engagement hooks 23 from the engaging holes 16 of the recess region 15. After the positioning element 2 is removed, the fixing portion 43 of the metal plate 40 of the extension card 4 is inserted into one of the inserting holes 13 on the set 1. Meanwhile, the bent portion 41 of the metal plate 40 is rested on the fin 11 of the set 1 to engage the notch 42 of the bent portion 41 with one of the bumps 12 of the fin 11. The stem 31 of the resilient plate 3 is pulled again to insert the folded portion 32 of the resilient plate 3 into the slot 18 of the set 1. At this moment, the mounting portion 21 of the positioning element 2 is pressed against the recess region 15 to engage the engagement hooks 23 with the engaging hole 16. Then, the stem 31 is released to allow the folded edge 32 of the resilient plate 3 to pass through the slot 24 of the positioning portion 2 in order to prevent any movement of the positioning element 2. Thereby, the metal plate 40 of the extension card 4 is firmly secured to the set 1.

In view of the above, the invention has the following advantages:

1. The engagement of the engagement hooks of the positioning element with the engaging holes of the set of extension slots, and the insertion of the folded edge of the resilient plate through the slot of the positioning portion allow an easier assembly/disassembly of the extension card, without the need of additional tools. The structure of the invention can, be applied to various computer casing with high productivity.

2. The pressing portion of the positioning element and the fin of the set of extension slots entirely cover the bent portion of the metal plate of the extension card. Thereby, the extension card is easily replaced while the attachment between the extension card and the computer casing is firmly achieved.

3. By means of the bump on the fin of the set of extension slots and the inserting hole under the slot on the set of extension slots, the metal plate of the extension card is firmly secured. The electrical connection between the extension card with a mainboard of a computer is thereby improved and the operation performance is enhanced. Furthermore, the maintenance and the assembly efficiency are improved.

It should be apparent to those skilled in the art that the above description is only illustrative of specific embodiments and examples of the invention. The invention should therefore cover various modifications and, variations made to the herein-described structure and operations of the invention, provided they fall within the scope of the invention as defined in the following appended claims.

What is claimed is:

1. A fixing structure for extension cards comprising a metal plate that has a bent portion at its top and a fixing portion at its bottom, and the bent portion further has a notch, the fixing structure comprising:

a set of extension slots, formed on a computer casing for fixing at least one extension card, wherein a fin outwardly extends from a rear side of the computer casing at a location above the extension slots, and an opening formed on the fin for receiving the bent portion of the metal plate of the extension card;

a positioning element, comprising a pressing portion for pressing against the fin, and a mounting portion vertically connected to the pressing portion, wherein the mounting portion has an engagement hook for engaging an engaging hole of the set of extension slots, and the mounting portion has a first mounting slot;

a resilient plate, centrally having a contact portion, wherein a stem extends from a back surface of the contact portion, a first folded edge is formed at a bottom of a front surface of the contact portion, the resilient plate further has a first fixing hole through which the resilient plate is fastened onto an inner wall of the computer casing by inserting a fastening element in a manner that the first folded portion of the resilient plate is inserted through the first mounting slot;

wherein the engagement hook of the positioning element respectively engages with the engaging hole of the set of extension slots, the folded edge of the resilient plate inserting through the first mounting slot of the positioning element to firmly secure the positioning element on the computer casing, the stem of the resilient plate being pulled toward an inside of the computer casing to release the folded edge of the contact portion from the first mounting slot of the positioning element so that the positioning element is pushed upward to disengage the engagement hook from the engaging hole of the set of extension slots.

2. The fixing structure of claim 1, further comprising a plurality of bumps formed on a top surface of the fin so that one of the bumps engages with the notch of the metal plate.

3. The fixing structure of claim 1, further comprising a plurality of inserting holes respectively formed under the extension slots on the rear side of the computer casing to respectively receive the fixing portion of the metal plate.

4. The fixing structure of claim 1, further comprising a recess region that is formed above the opening on the rear side of the computer casing, wherein the engaging hole is located in the recess region.

5. The fixing structure of claim 1 or 4, further comprising at least one second fixing hole formed near the engaging hole corresponding to the first fixing hole.

6. The fixing structure of claim 4, further comprising a second mounting slot formed near a middle portion of a lower edge of the recess region in a manner that the second mounting slot corresponds to the first mounting slot.

7. The fixing structure of claim 1, further comprising a second folded edge formed along a side of the pressing portion.

8. The fixing structure of claim 4, wherein the engagement hook is formed in a manner to respectively engage with the engaging hole of the recess region so that the mounting portion abuts against the recess region.

9. The fixing structure of claim 1, further comprising two curved portions respectively extending from two opposite sides of the contact portion.

10. The fixing structure of claim 9, further comprising two fixing pieces that respectively extend from the curved portions along a length of the contact portion.

* * * * *